United States Patent [19]

Fujishima

[11] Patent Number: 5,283,762
[45] Date of Patent: Feb. 1, 1994

[54] SEMICONDUCTOR DEVICE CONTAINING VOLTAGE CONVERTING CIRCUIT AND OPERATING METHOD THEREOF

[75] Inventor: Kazuyasu Fujishima, Hyogo, Japan

[73] Assignee: Mitsubishi Denki Kabushiki Kaisha, Tokyo, Japan

[21] Appl. No.: 695,028

[22] Filed: May 6, 1991

[30] Foreign Application Priority Data

May 9, 1990 [JP] Japan .................................. 2-120746
Jun. 5, 1990 [JP] Japan .................................. 2-148130

[51] Int. Cl.$^5$ ........................................... G11C 13/00
[52] U.S. Cl. ................................. 365/189.09; 307/65; 365/226
[58] Field of Search .......................... 365/189.09, 226; 307/64, 65

[56] References Cited

U.S. PATENT DOCUMENTS

| 4,638,175 | 1/1987 | Bradford et al. | 327/65 X |
| 4,780,854 | 10/1988 | Watanabe et al. | 365/226 |
| 4,806,788 | 2/1989 | Tobita | 307/296 R |
| 5,065,091 | 11/1991 | Tobita | 324/158 R |
| 5,153,452 | 10/1992 | Iwamura et al. | 365/226 X |

FOREIGN PATENT DOCUMENTS

| 3722421 | 7/1987 | Fed. Rep. of Germany . |
| 4007187 | 9/1990 | Fed. Rep. of Germany . |
| 63-207000 | 2/1987 | Japan . |
| 1-85461 | 1/1988 | Japan . |
| 63-181196 | 7/1988 | Japan . |
| 64-55857 | 2/1989 | Japan . |

OTHER PUBLICATIONS

IEEE Journal of Solid-State Circuits, vol. SC-22, No. 3, Jun. 1987, "A New On-Chip Voltage Converter for Submicrometer High-Density DRAM's", by Tohru Furuyama et al., pp. 437-441.

German publication "Salhofer Elektronik", Hauptkatalog 91/92, p. 329.

*Primary Examiner*—James B. Mullins
*Attorney, Agent, or Firm*—Lowe, Price, LeBlanc & Becker

[57] ABSTRACT

The semiconductor memory device contains a voltage converting circuit. The voltage converting circuit includes a plurality of reference voltage generating circuits for respectively generating a plurality of reference voltages at different levels. The voltage converting circuit further includes a differential amplifier, an output circuit, a switching circuit and a switching control circuit. The switching control circuit and the switching circuit select one of the plurality of reference voltages and supply the selected reference voltage to the differential amplifier in response to an externally applied control signal. The differential amplifier and the output circuit apply the supplied reference voltage to an internal circuit.

26 Claims, 14 Drawing Sheets

SEMICONDUCTOR DEVICE CONTAINING VOLTAGE CONVERTING CIRCUIT AND OPERATING METHOD THEREOF

BACKGROUND OF THE INVENTION

1. Field of the Invention

The invention relates generally to semiconductor devices, and more particularly, to a semiconductor device and the operating method thereof, containing a voltage converting circuit for converting an externally applied power supply voltage to a predetermined voltage and providing the same to an internal circuit.

2. Description of the Background Art

Recently, examples of development have been published in a 4M-bit static random access memory (hereinafter referred to as SRAM) and a 16M-bit dynamic random access memory (hereinafter referred to as DRAM) utilizing a micro-lithography technology at a 0.5 μm level. In these 4M-bit SRAM and 16M-bit DRAM, a short channel MOS transistor is used, having a gate length of 0.6 μm or below. In a conventional 4M-bit DRAM and the like, an MOS transistor is used, which has a gate length from 1 μm to about 0.8 μm, and operates at a power supply voltage of 5 V.

When a short channel MOS transistor, which is used in the above-mentioned 4M-bit SRAM and 16M-bit DRAM, is operated at a power supply voltage of 5 V, it is noted that a degradation of a transistor characteristic is caused to a degree that is not negligible, presenting a problem of reliability.

In order to use a short channel MOS transistor having a gate length of about 0.5 μm, controlling such a degradation of the transistor characteristic, it is intended to change the power supply voltage from 5 V, for example, to 3.3 V. When a compatibility with a power supply system of 5 V which has been widely used so far is considered, however, there is a problem in the change of a power supply voltage.

Accordingly, a semiconductor device is proposed, in which a voltage converting circuit is integrated. In the semiconductor device, an externally applied power supply voltage is held at 5 V, and the power supply voltage is reduced to a constant voltage by the voltage converting circuit, thereby allowing the internal circuit to be operated at a constant voltage independent of the fluctuation of the power supply voltage.

FIG. 14 is a block diagram showing one example of a conventional semiconductor device containing a voltage converting circuit. FIG. 15 is a diagram showing a specified circuit structure of the voltage converting circuit shown in FIG. 14. The voltage converting circuit of FIG. 15 is proposed, for example, by T. Furuyama et al. in IEEE Journal of Solid-State Circuits, Vol. SC-22, No. 3, pp. 437-441, June 1987.

The semiconductor device 100 of FIG. 14 contains a voltage converting circuit 101, an internal circuit 105 and an input-output circuit 106. The internal circuit 105 comprises a memory, for example, a DRAM.

The voltage converting circuit 101 contains a reference voltage generating circuit 102, a differential amplifier 103 and a switching circuit 104. The semiconductor device 100 has a power supply terminal 10 for receiving a power supply voltage Vcc and a ground terminal 30 for receiving a ground voltage Vss. The reference voltage generating circuit 102 receives the externally applied power supply voltage Vcc and generates a reference voltage Vr almost independent of the power supply voltage Vcc. The reference voltage Vr is supplied to the differential amplifier 103, and an internal voltage Vi independent of the fluctuations of the power supply voltage Vcc and the load current is generated by the differential amplifier 103 and the switching circuit 104 and supplied to the internal circuit 105. The power supply voltage Vcc is, for example, 5 V, and the internal voltage Vi is, for example, 3.5 V.

The input-output circuit 106 is often directly driven by the power supply voltage Vcc externally applied, taking account of the connection with the peripheral logic LSI of a 5 V power supply system. Therefore, it is planned not to use a minimum gate length in the transistor of the input-output circuit 106. When the internal circuit 105 contains a memory such as a DRAM, the input-output circuit 106 mainly contains a buffer circuit. The input-output circuit 106 externally receives an address signal AD over an address terminal 40, and supplies the address signal AD to the internal circuit 105. The input-output circuit 106 supplies data DQ read from the internal circuit 105 to an external circuit over a data terminal 50, or provides externally applied DQ to the data terminal 50 to the internal circuit 105. Furthermore, the input-output circuit 106 provides a control signal CNT externally applied over a control terminal 60 to the internal circuit 105.

In FIG. 15, the reference voltage generating circuit 102 contains P channel MOS transistors 21 to 25. The transistors 21 to 23 are serially connected between the power supply terminal 10 and the ground terminal 30. The power supply voltage Vcc is voltage-divided by the transistors 21 to 23, and the voltage-divided voltage appears on the node N1. The transistor 24 is connected between the power supply terminal 10 and the node N2, and the transistor 25 is connected between the node N2 and the ground terminal 30.

When the power supply voltage Vcc is increased, the voltage of the node N1 is also increased, causing the transistor 24 to be in a non-conductive state. Thus, the increase in the voltage of the node N2 is prevented. Conversely, when the power supply voltage Vcc is reduced, the voltage of the node N1 is also reduced, causing the transistor 24 to be in a conductive state. Thus, the reduction in the voltage of the node N2 is prevented. In this way, a reference voltage Vr is generated from the node N2, almost independent of the fluctuation of the power supply voltage Vcc.

The differential amplifier 103 contains a current mirror circuit including P channel MOS transistors 31, 32 and N channel MOS transistors 33, 34. The gate of the transistor 31 is connected to the node N2 of the reference voltage generating circuit 102. A large-sized P channel MOS transistor 35 and a small-sized P channel MOS transistor 36 are connected between the node N3 which is a connection point of the transistors 31 and 32, and the power supply terminal 10. These transistors 35, 36 are added for reducing power consumption of the current mirror circuit.

In the period in which the internal circuit 105 operates, a clock signal $\phi 0$ applied to the gate of the transistor 35 attains a low level (logically low level), and the transistor 35 turns on. Thus, the responsibility of the current mirror circuit is increased. In the period in which the internal circuit 105 does not operate, the clock signal $\phi 0$ attains a high level (logically high level), and the transistor 35 turns off. In this case, the small-sized transistor 36 where a very small amount of current flows only turns on, so that the power consumption is controlled.

The switching circuit 104 includes a P channel MOS transistor 41. The gate of the transistor 32 in the current mirror circuit is connected to the node N4. The transistor 41 is connected between the power supply terminal 10 and the node N4. The gate of the transistor 41 is connected to the node N5 which is a connection point of the transistor 31 and the transistor 33 in the current mirror circuit.

When the internal voltage Vi supplied from the node N4 becomes higher than the reference voltage Vr, the value of the current flowing through the transistor 31 becomes larger than the value of the current flowing through the transistor 32. Thus the potential of the node N5 is increased. The transistor 41, therefore, falls in a weakly conductive state or a non-conductive state. As a result, the provision of the current from the power supply terminal 10 to the node N4 is stopped or reduced, and the internal voltage Vi is decreased.

Conversely, when the internal voltage Vi becomes lower than the reference voltage Vr, the value of the current flowing through the transistor 31 becomes smaller than the value of the current flowing through the transistor 32. The potential of the node N5 is decreased. Therefore, the transistor 41 falls in a conductive state, and a sufficient amount of current is supplied from the power supply terminal 10 to the node N4. As a result, the internal voltage Vi is increased.

Thus, a constant internal voltage Vi may be obtained, independent of the fluctuation of the power supply voltage Vcc or the fluctuation of the load current.

FIG. 16 is a diagram showing a voltage converting characteristic of the voltage converting circuit in FIG. 15. In FIG. 16, the marks O indicate measured values, and the solid line L1 shows a simulated characteristic.

As shown in FIG. 16, the internal voltage Vi is kept at about 3.5 V set as the reference voltage Vr in the region where the externally applied power supply voltage Vcc is about 3.5 V or above.

In order to assure a stable operation of semiconductor devices used in a variety of environments, devices whose operations are unstable are rejected as defective, effecting an operating margin test before shipping. In the operating margin test, an operating test of a semiconductor device is conducted, providing a low voltage or a high voltage exceeding the range of operation ensuring voltage to the semiconductor. When 5 V±10% of operation is to be assured, for example, the test is conducted within the range of 5 V±20%.

In order to effect screening of defective products at the time of shipping, or assume the lifetime when used for long time, an acceleration aging test is effected by externally applying a high voltage as would not be normally used as a power supply voltage Vcc to the semiconductor device. For example, when the normal power supply voltage Vcc is 5 V, a high voltage of 7 V is applied. In this case, screening of defective products means selecting defective products by an acceleration aging test in order to insure the reliability of the semiconductor device in the market. When such an operating margin test and an acceleration aging test are intended to be applied to a semiconductor device containing a voltage converting circuit as shown in FIG. 14, as will be apparent from FIG. 16, the externally applied high voltage is not applied in the chip, so that an effective test can not be conducted.

FIG. 17 shows a semiconductor integrated circuit device capable of externally applying a high voltage in an acceleration aging test. The semiconductor integrated circuit device in FIG. 17 is disclosed in Japanese Patent Laying-Open No. 64-55857.

In FIG. 17, a power supply voltage converting circuit 111 externally receives the power supply voltage Vcc and generates an internal voltage Vi at a lower level than that of the power supply voltage Vcc. Normally, the internal voltage Vi generated from the power supply voltage generating circuit 111 is provided to an integrated circuit block 113 over an internal power supply line 112. In an acceleration aging test, a transistor 114 attains a conductive stage by a switching signal $\phi 1$, and an externally applied high voltage Ve is supplied to the integrated circuit block 113 over the transistor 114 and the internal power supply line 112.

In the semiconductor integrated circuit device of FIG. 17, a variety of tests may be conducted by setting the externally applied high voltage Ve to an arbitrary level. The semiconductor integrated circuit device in FIG. 17, however, has problems which will be described in the following.

Referring to the wave form diagram of FIG. 18, generally, when a clock signal CK for controlling the operation of a semiconductor integrated circuit device transits from a high level to a low level, the state of the internal circuit changes and a current flows. Thus, the power supply current I indicates a peak. Such a peak of the power supply current I may be also observed when the clock signal CK transits from a low level to a high level. The power supply current I is provided from the external power supply via the power supply voltage converting circuit 111 to the internal integrated circuit block 113. The impedance of an output circuit (not shown) included in the power supply voltage converting circuit 111 functions as a current limiting resistor. Thus, the output circuit of the power supply voltage converting circuit 111 functions as a resistor, so that there occurs a voltage drop in the internal voltage Vi. Therefore, as shown in FIG. 18, the fluctuation of the voltage of the internal voltage Vi becomes larger compared with the voltage fluctuation of the power supply voltage Vcc. That is, the externally applied power supply voltage Vcc becomes more stable than the internal voltage Vi.

In the semiconductor integrated circuit device in FIG. 17, the amount of fluctuation of the internal voltage Vi applied to the integrated circuit block 113 at the time of normal use is different from the amount of fluctuation of the high voltage Ve applied to the integrated circuit block 113 at the time of an acceleration aging test. Therefore, there is a problem that the operating condition of the integrated circuit block 113 at the time of an acceleration aging test differs from the operating condition at the time of actual use.

Additionally, there is a possibility that the semiconductor integrated circuit device is erroneously set to an operation test mode at the time of normal use if the switch signal $\phi 1$ is generated for some reason. In this case, there is a problem that a high voltage is applied to the integrated circuit block 113 and the integrated circuit block 113 is destroyed.

FIG. 19 shows another example of a conventional power supply voltage converting circuit. This power supply voltage converting circuit is disclosed in Japanese Patent Laying-Open No. 63-181196.

The power supply voltage converting circuit of FIG. 19 includes a reference voltage signal generating portion 120 for generating a reference voltage Vr corresponding to the voltage level of a control signal from a control terminal 125 and a converter 130 for converting a power supply voltage Vcc to an internal voltage Vi corresponding to the reference voltage.

Transistors 121 to 124 are connected between the control terminal 125 and the node N10 within the reference voltage signal generating portion 120. Assuming that the threshold voltages of the transistors 121 to 124 are all Vt, when the voltage of the control terminal 125 becomes higher than the voltage of the node N10 by 4 Vt or above, the reference voltage Vr rises, and the internal voltage Vi supplied from the converting portion 130 also rises. When the voltage of the control terminal 125 is at or below the value, the reference voltage Vr does not change, and the internal voltage Vi supplied from the converter 130 does not change, either.

In accordance with the power supply voltage converting circuit in FIG. 19, the internal voltage Vi generated from the converter 130 may be provided both at the time of normal use and at the time of an acceleration aging test, so that there is no problem as in the semiconductor integrated circuit of FIG. 17.

In the power supply voltage converting circuit in FIG. 19, however, an internal voltage Vi at a higher level than at the time of normal use may be generated by applying a high voltage to the control terminal 125, whereas an internal voltage at a lower level than at the time of normal use cannot be generated. Accordingly, it is impossible to apply various internal voltages to the internal circuit and conduct a V bump test (voltage fluctuation test) for checking the operation margin.

SUMMARY OF THE INVENTION

An object of the invention is to provide a semiconductor device containing a voltage converting circuit capable of providing internal voltages at various levels to the internal circuit on the same condition as at the time of normal use, and the operating method thereof.

Another object of the invention is to provide a semiconductor device capable of providing power supply voltages at various levels to the internal circuit in an operation test, which is not erroneously set to an operation test mode at the time of normal use, and an operating method thereof.

Still another object of the invention is to provide power supply voltages at various levels to the internal circuit in an operating test of a semiconductor device on the same condition as at the time of normal use, and prevent the semiconductor device from being erroneously set to an operation test mode at the time of normal use.

The semiconductor device in accordance with the invention includes a voltage converting circuit for converting an externally applied power supply voltage to a predetermined voltage and supplying the same to an internal circuit. The voltage converting circuit includes a reference voltage generation circuit, a selection circuit, and an output circuit. The reference voltage generation circuit receives an externally applied power supply voltage and supplies a plurality of reference voltages at different levels. The selection circuit selects one of the plurality of reference voltages in response to an externally applied control signal. The output circuit supplies the reference voltage selected by the selection circuit to the internal circuit.

At the time of normal use, a predetermined reference voltage among the plurality of reference voltages is selected and provided to the internal circuit. At the time of a test such as an acceleration aging test or a V bump test, a reference voltage necessary for the test among the plurality of reference voltages is selected, and provided to the internal circuit.

Similarly, at the time of normal use, the reference voltage generated from the reference voltage generation circuit is supplied to the internal circuit over the same output circuit, so that the test is conducted by the reference voltage on the same condition as at the time of normal use.

Additionally, it becomes possible to provide reference voltages at various levels to the internal circuit by setting the level of a reference voltage generated from the reference voltage generation circuit to various levels.

Thus, both at the time of normal use and at the time of a test, voltages at different levels may be provided to the internal circuit on the same conditions, and a voltage at any level may be provided to the internal circuit by an internally applied control signal. Therefore, it becomes possible to readily conduct a variety of tests on the internal circuit, so that a semiconductor device of high quality may be obtained.

A semiconductor device in accordance with another aspect of the invention comprises first and second power supply terminals, a voltage converting circuit, an internal circuit, a detecting circuit, and a switching circuit.

The first and the second power supply terminals externally receive first and second power supply voltages respectively. The voltage converting circuit receives the first power supply voltage from the first power supply terminal and converts the first power supply voltage to a predetermined voltage. The internal circuit operates by a predetermined voltage converted by the voltage converting circuit. The detecting circuit receives the first and the second power supply voltages and detects that the voltage difference between the first and the second power supply voltages becomes a predetermined voltage difference. The switching circuit causes the internal circuit to operate by either of the first and the second power supply voltages in place of the predetermined voltage converted by the voltage converting circuit when the detecting circuit detects a predetermined voltage difference.

At the time of normal use, the externally applied first power supply voltage is converted to a predetermined voltage and supplied to the internal circuit. When the voltage difference between the first and the second power supply voltages applied to the first and the second power supply terminals becomes a predetermined voltage difference, the internal circuit is operated by either one of the first and the second power supply voltages. Therefore, in an operation margin test or an acceleration aging test, the internal circuit means may be operated at a low voltage or at a high voltage which are not normally used, by keeping the voltage difference between the first and the second power supply voltages at or above a predetermined voltage difference.

In this way, the internal circuit is operated by either one of the first and the second power supply voltages when the voltage difference between the first and the second power supply voltages externally applied becomes a predetermined voltage difference, so that the internal circuit may be operated by a predetermined voltage converted by the voltage converting circuit at the time of normal use, and the internal circuit may be operated by any voltage at the time of an operation test such as an operation margin test or an acceleration aging test.

Furthermore, the internal circuit is operated by an externally applied voltage when the voltage difference between the first and the second power supply voltages becomes a predetermined voltage difference, so that an erroneous setting of the semiconductor device to the operation test mode at the time of normal use is avoided, and the internal circuit is also prevented from being destroyed by a high voltage.

The foregoing and other objects, features, aspects and advantages of the present invention will become more apparent from the following detailed description of the present invention when taken in conjunction accompanying drawings.

DESCRIPTION OF THE PREFERRED EMBODIMENTS

Figure 1:
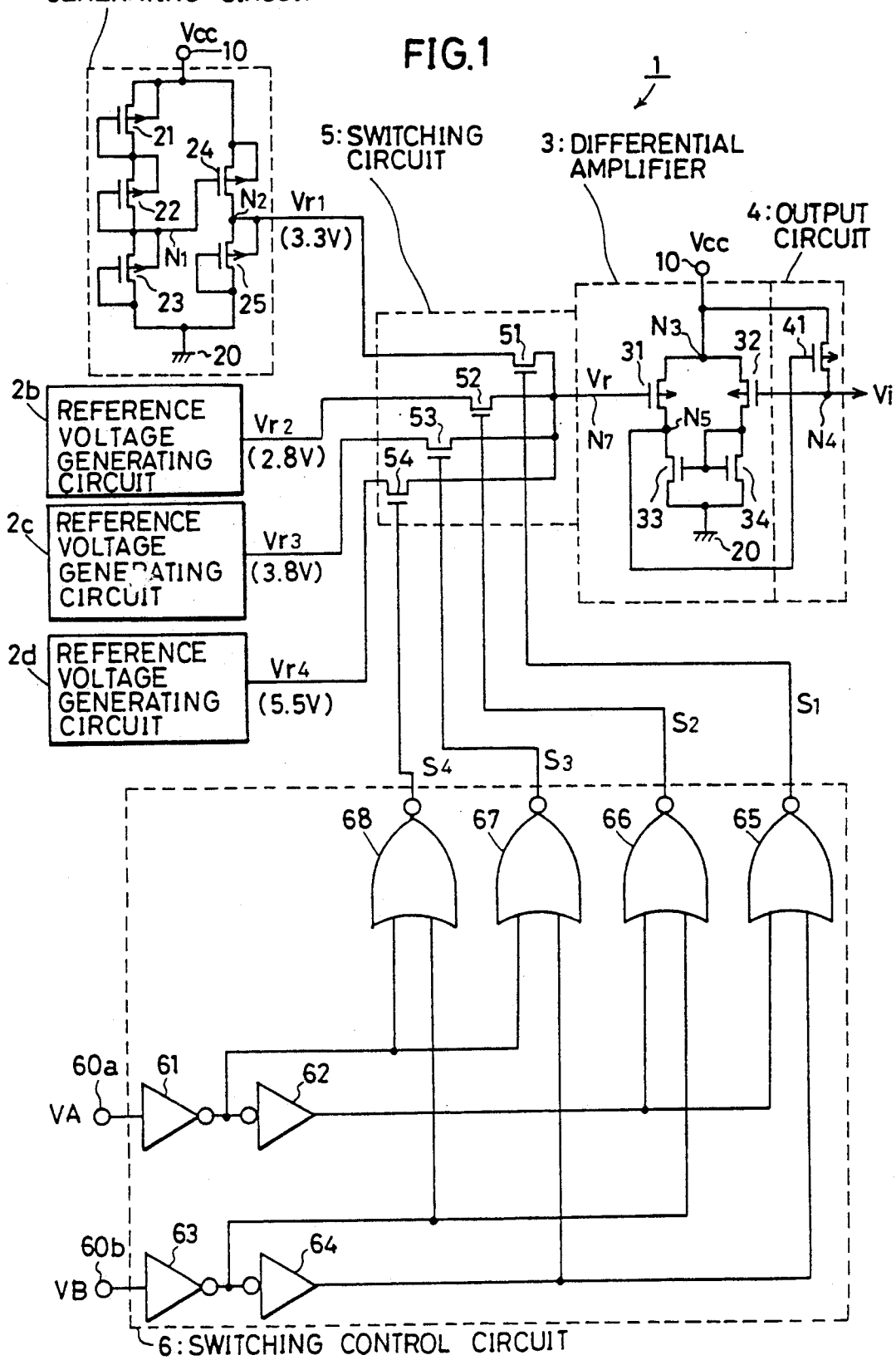
FIG. 1 is a circuit diagram the structure of a voltage converting circuit included in a semiconductor device in accordance with a first embodiment of the invention.

The voltage converting circuit 1 of FIG. 1 includes a plurality of reference voltage generating circuits 2a, 2b, 2c, 2d. The circuit structure of each of the reference voltage generating circuits 2a to 2d is the same as the circuit structure of the reference voltage generating circuit 102 shown in FIG. 8. However, the levels of the reference voltages Vr1 to Vr4 supplied respectively from those reference voltage generating circuits 2a to 2d are different. For example, the reference voltage Vr1 supplied from the reference voltage generating circuit 2a is set to 3.3 V, and the reference voltage Vr2 supplied from the reference voltage generating circuit 2b is set to 2.8 V. The reference voltage Vr3 supplied from the reference voltage generating circuit 2c is set to 3.8 V, and the reference voltage Vr4 supplied from the reference voltage generating circuit 2d is set to 5.5 V.

Setting of a reference voltage is conducted by changing the channel length, the channel width or the threshold voltage of P channel MOS transistors 21 to 25. The level of the reference voltage can be also changed by changing the number of P channel MOS transistors connected serially between the power supply terminal 10 and the ground terminal 20.

The reference voltages Vr1 to Vr4 are supplied to a differential amplifier 3 over a switching circuit 5. The switching circuit 5 includes four N channel MOS transistors 51, 52, 53, 54. The reference voltage Vr1 is supplied to the node N7 over the transistor 51, and the reference voltage Vr2 is supplied to the node N7 over the transistor 52. The reference voltage Vr3 is supplied to the node N7 over the transistor 53, and the reference voltage Vr4 is supplied to the node N7 over the transistor 54. Switching signals S1 to S4 are respectively supplied to the gates of the transistors 51 to 54 from a switching control circuit 6.

Figure 15:
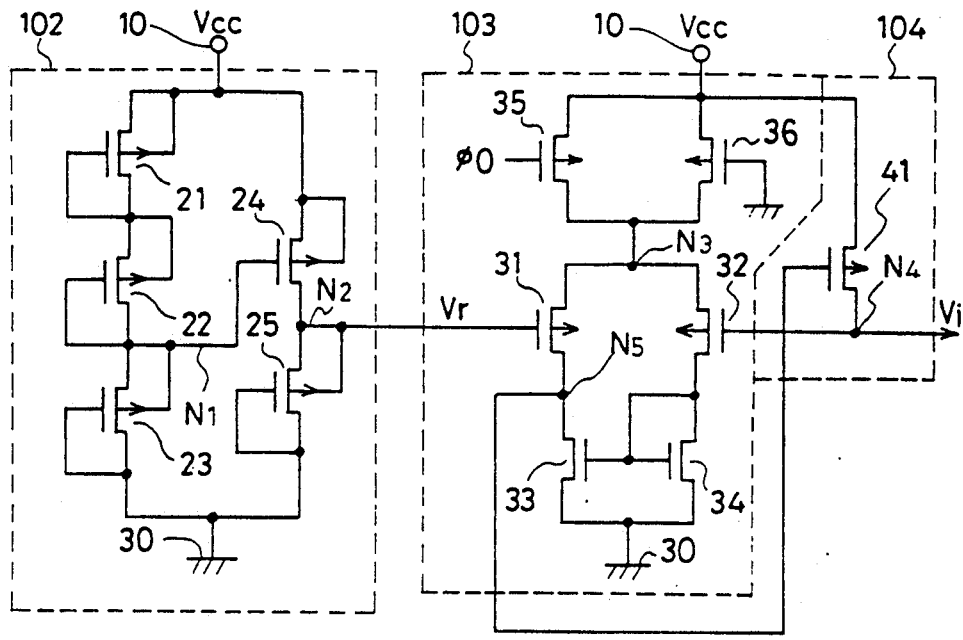
FIG. 15 is a circuit diagram showing a specific structure of the voltage converting circuit included in FIG. 14.
Figure 16:
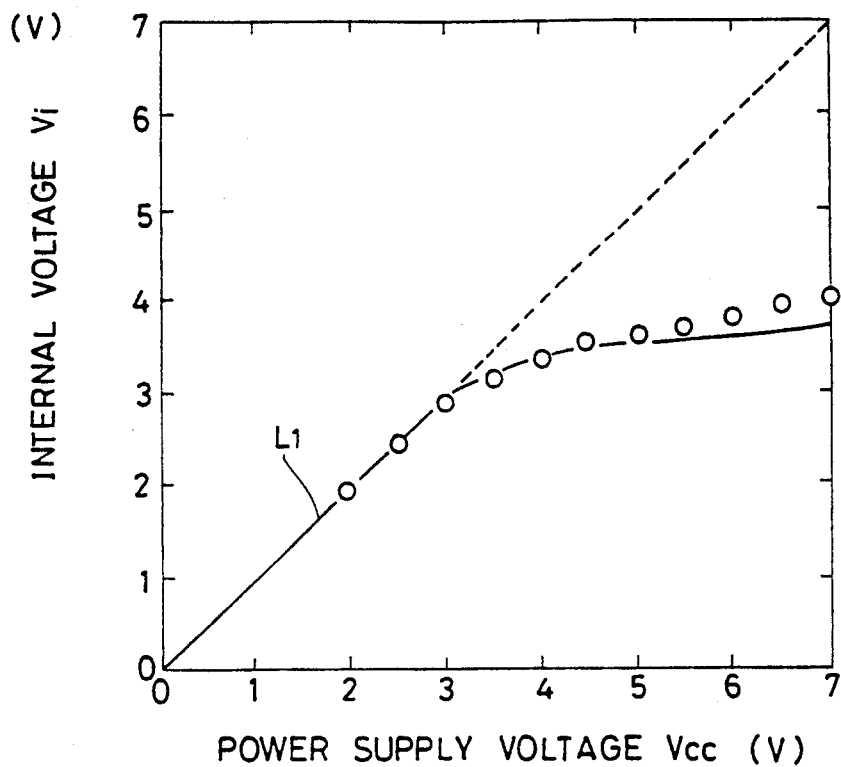
FIG. 16 is a diagram showing an output voltage characteristic of the voltage converting circuit of FIG. 15.
Figure 17:
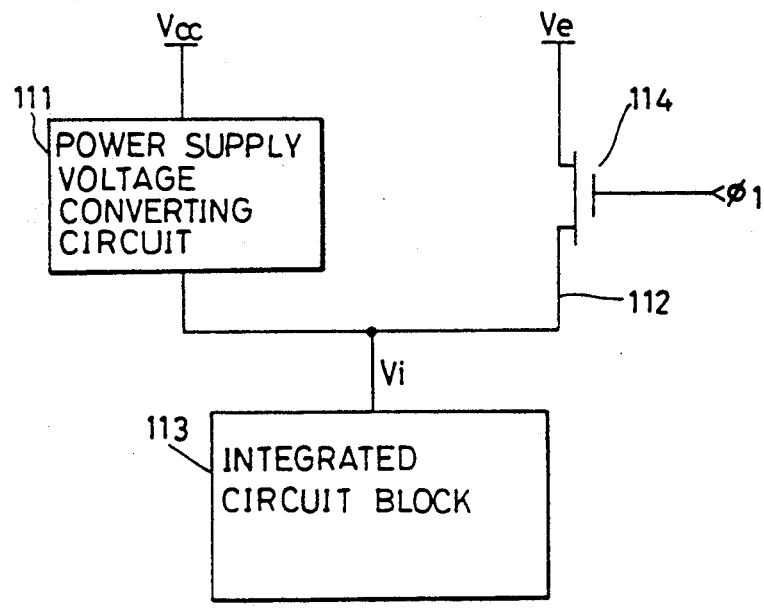
FIG. 17 is a block diagram showing an example of a conventional semiconductor integrated circuit device including a power supply voltage converting circuit.
Figure 18:
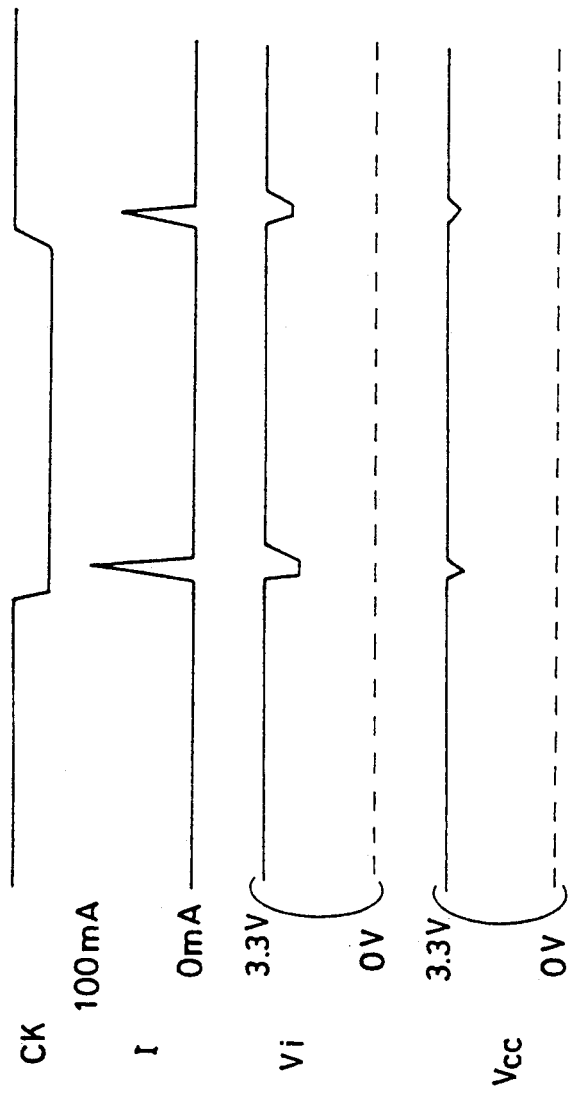
FIG. 18 is a wave form diagram for describing the relationship between the internal voltage and the power supply voltage in a conventional semiconductor integrated circuit device containing a voltage converting circuit.
Figure 19:
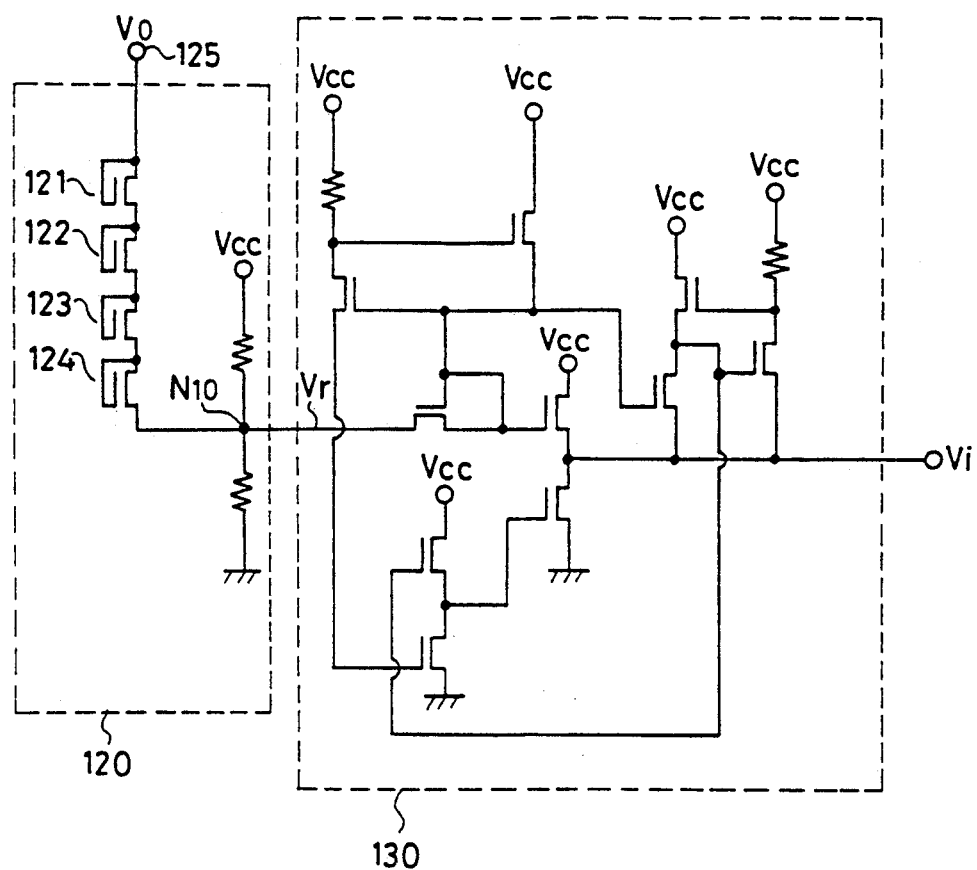
FIG. 19 is a circuit diagram showing another example of a conventional voltage converting circuit.

The differential amplifier 3 has the same structure as that of the differential amplifier 103 shown in FIG. 15. However, the node N3 is directly connected to the power supply terminal 10 without transistors 35, 36 shown in FIG. 15 being connected between the node N3 of the differential amplifier 3 and the power supply terminal 10. The transistors 35, 36 may be connected between the node N3 and the power supply terminal 10 as in the differential amplifier 103 of FIG. 15.

The structure of the output circuit 4 is the same as the structure of the switching circuit (output circuit) 104 shown in FIG. 15. The operations of the differential amplifier 3 and the output circuit 4 are also the same as the operations of the differential amplifier 103 and the switching circuit 104 shown in FIG. 15.

The switching control circuit 6 includes inverters 61, 62, 63, 64 and NOR gates 65, 66, 67, 68. A control signal VA supplied to the control terminal 60a is inverted by the inverter 61 and supplied to one input terminal of each of the NOR gates 67, 68. The output signal of the inverter 61 is further inverted by the inverter 62 and supplied to one input terminal of each of the NOR gates 65, 66. A control signal VB supplied to the control terminal 60b is inverted by the inverter 63 and supplied to the other input terminal to each of the NOR gates 66, 68. The output signal of the inverter 63 is further inverted by the inverter 64, and supplied to the other input terminal of each of the NOR gates 65, 67. Switching signals S1 to S4 are respectively supplied from the output terminals of the NOR gates 65 to 68.

Figure 2:
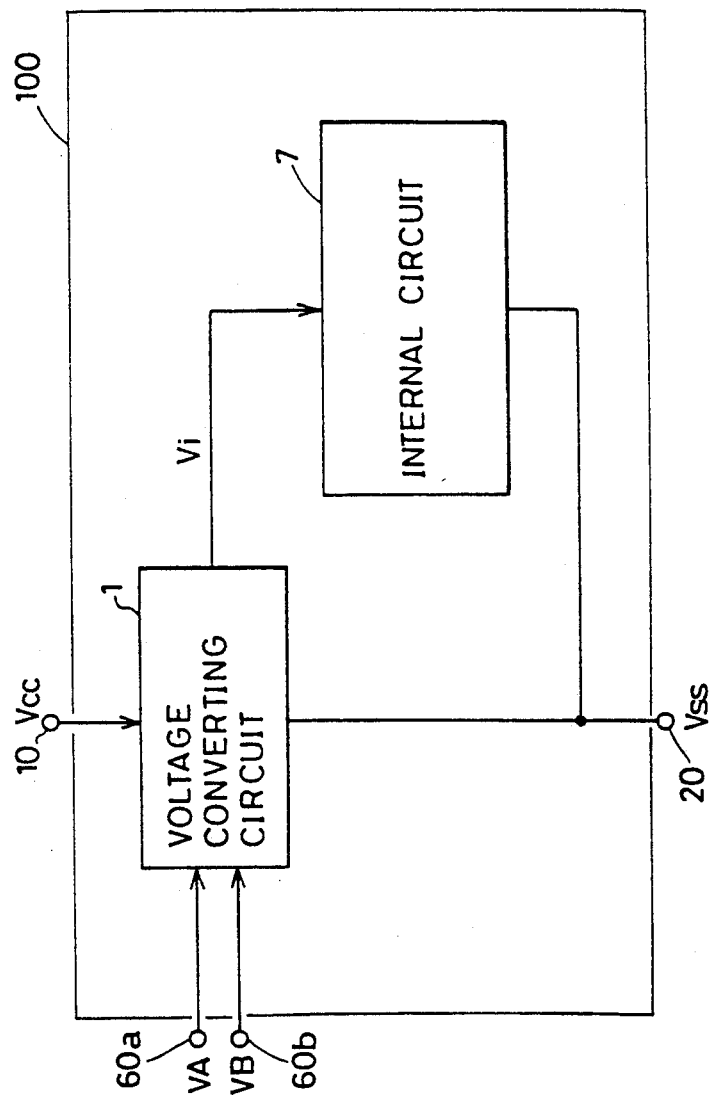
FIG. 2 is a block diagram showing the structure of the semiconductor device containing the voltage converting circuit of FIG. 1.

FIG. 2 is a block diagram showing the configuration of the semiconductor device 100 containing the voltage converting circuit 1 of FIG. 1. The voltage converting circuit 1 is connected between the power supply terminal 10 for externally receiving the power supply voltage Vcc and the ground terminal 20 for receiving the ground potential Vss. The voltage converting circuit 1 is externally provided with the control signals VA, VB over the control terminals 60a, 60b. The internal circuit 7 is provided with the internal voltage Vi supplied from the voltage converting circuit 1. The internal circuit 7 includes, for example, a DRAM.

Figure 3:
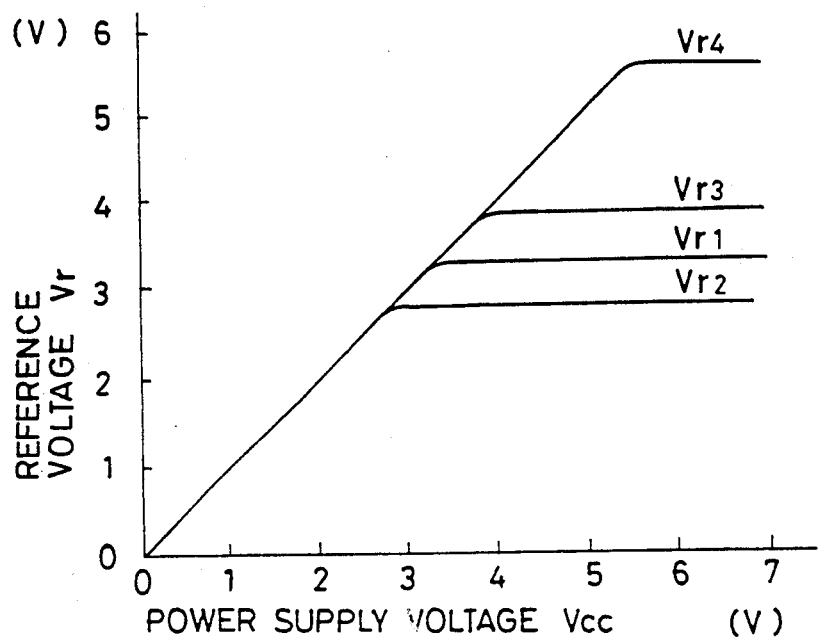
FIG. 3 is a diagram showing an output voltage characteristic of a plurality of reference voltage generating circuits included in the voltage converting circuit of FIG. 1.
Figure 4:
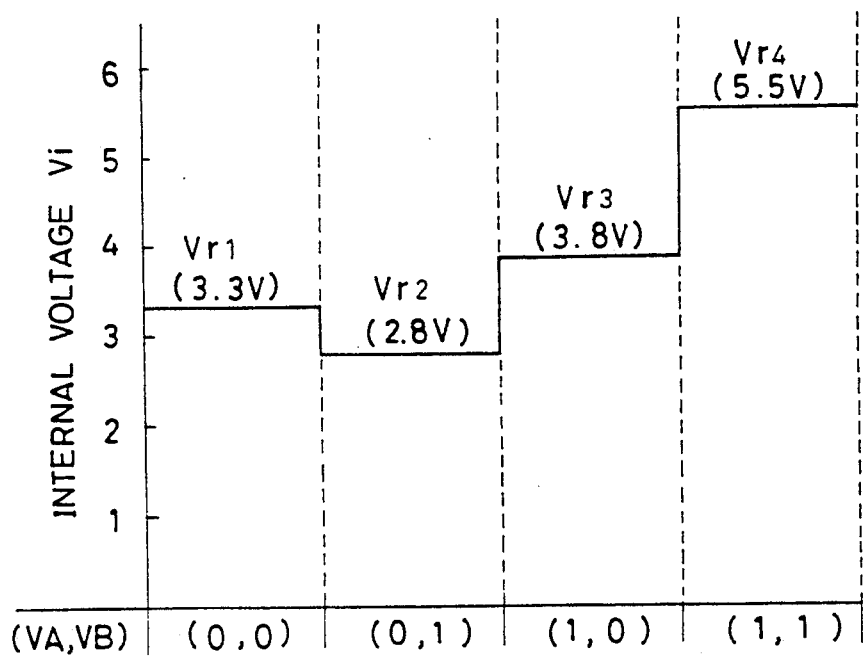
FIG. 4 is a diagram showing a plurality of different internal voltages Vi generated by the voltage converting circuit of FIG. 1.

The operation of the voltage converting circuit 1 shown in FIGS. 1 and 2 will now be described with reference to FIGS. 3 and 4. FIG. 3 shows how the reference voltage Vr depends on the power supply voltage Vcc, and FIG. 4 shows how the internal voltage Vi depends on the combination of the control signals VA, VB.

The voltage converting circuit 1 generates a low reference voltage Vr2 of 2.8 V, a high reference voltage Vr3 of 3.8 V and an excessive reference voltage Vr4 of 5.5 V for an acceleration aging test other than a normally used reference voltage Vr1 of 3.3 V. The excessive reference voltage Vr4 is generated when the power supply voltage Vcc is, for example, 6 V or above.

In normal operation, the combination of the control signals (VA, VB) is set to (0, 0), whereby, the switching signal S1 supplied from the NOR gate 65 of the switching control circuit 6 only attains an H level, so that the transistor 51 in the switching circuit 5 turns on, and the reference voltage Vr1 is supplied to the node N7 of the differential amplifier 3. The internal voltage Vi supplied from the output circuit 4 therefore attains 3.3 V.

Similarly, when the combination of the control signals (VA, VB) is set to (0, 1), (1, 0), (1, 1), the internal voltage Vi supplied from the output circuit 4 attains 2.8 V, 3.8 V, 5.5 V, respectively.

At the time of the V bump test, after writing in the internal circuit 7 comprised of DRAM with the internal voltage Vi being set to a low level, reading from the internal circuit 7 is conducted with the internal voltage Vi being set to a high level, and the operation margin is checked. Firstly, the combination of the control signals is set to (0, 1) with the power supply voltage Vcc of 5 V being applied to the power supply terminal 10 to effect write operation. Then, the combination of the control signals is switched to (1, 0) to effect read operation.

At the time of an acceleration aging test, an overvoltage which is not normally used is applied to the internal circuit 7. At first, after applying a power supply voltage Vcc of 6 V to the power supply terminal 10, the combination of the control signals is set to (1, 1), so that an internal voltage Vi of 5.5 V is supplied to the internal circuit 7.

In the embodiment of FIG. 1, the switching circuit 5 and the switching control circuit 6 constitute selection means. Selection means for selecting one of the plurality of reference voltages is not limited to the structure of FIG. 1.

Figure 5:
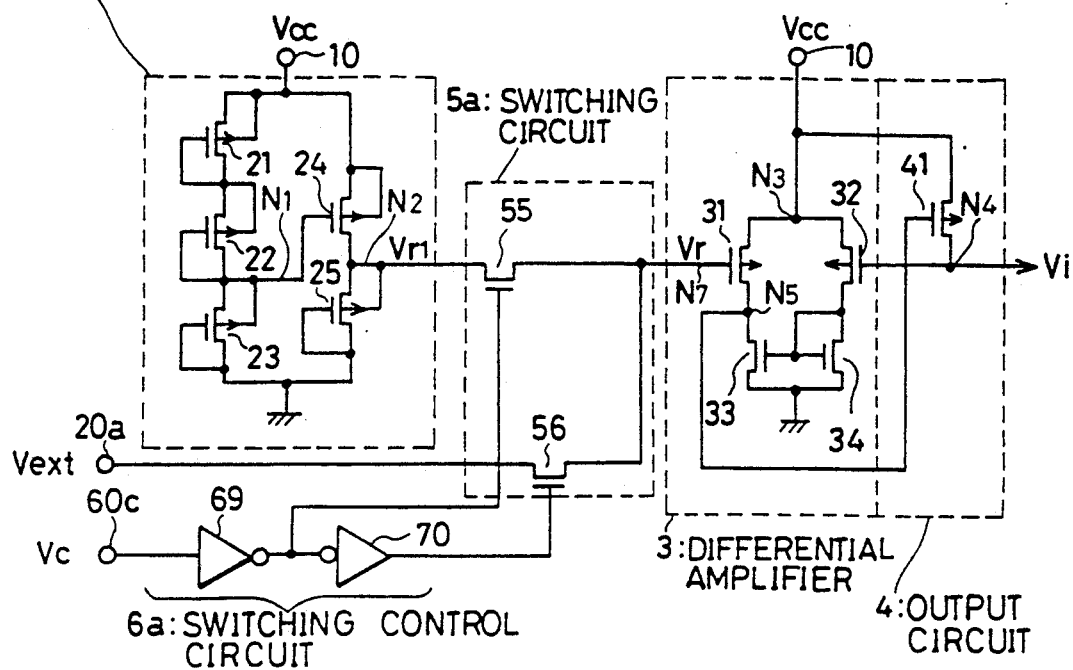
FIG. 5 is a circuit diagram showing the structure of a voltage converting circuit included in a semiconductor device in accordance with a second embodiment of the invention.

FIG. 5 is the circuit diagram showing the structure of a voltage converting circuit included in a semiconductor device according to a second embodiment of the invention.

The voltage converting circuit of FIG. 5 is different from the voltage converting circuit of FIG. 1 in a way as follows. In the voltage converting circuit of FIG. 5, instead of providing a plurality of reference voltage generating circuits, a reference voltage Vr1 supplied from one reference voltage generating circuit 2 and an external reference voltage Vext externally applied to the external terminal 20a are selectively provided to the differential amplifier 3 by the switching circuit 5a.

The switching circuit 5a includes N channel MOS transistors 55, 56. The reference voltage Vr1 supplied from the reference voltage generating circuit 2 is supplied to the node N7 of the differential amplifier 3 over the transistor 55. The external reference voltage Vext externally applied to the external terminal 20a is supplied to the node N7 of the differential amplifier 3 over the transistor 56.

The switching control circuit 6a includes inverters 69, 70. The control signal VC externally applied to the control terminal 60c is inverted by the inverter 69 and supplied to the gate of the transistor 55. The output signal of the inverter 69 is further inverted by the inverter 70 and supplied to the gate of the transistor 56.

At the time of normal operation, the control signal VC is set to "0". As a result, the transistor 55 turns on, and the reference voltage Vr1 supplied from the reference voltage generating circuit 2 is applied to the differential amplifier 3.

At the time of a V bump test or an acceleration aging test, the control signal VC is set to "1". As a result, the transistor 56 turns on, and the external reference voltage Vext applied to the external terminal 20a is supplied to the differential amplifier 3. In this case, it becomes possible to conduct the above-mentioned V bump test or the acceleration aging test by providing voltages of various levels as an external reference voltage Vext.

Figure 6:
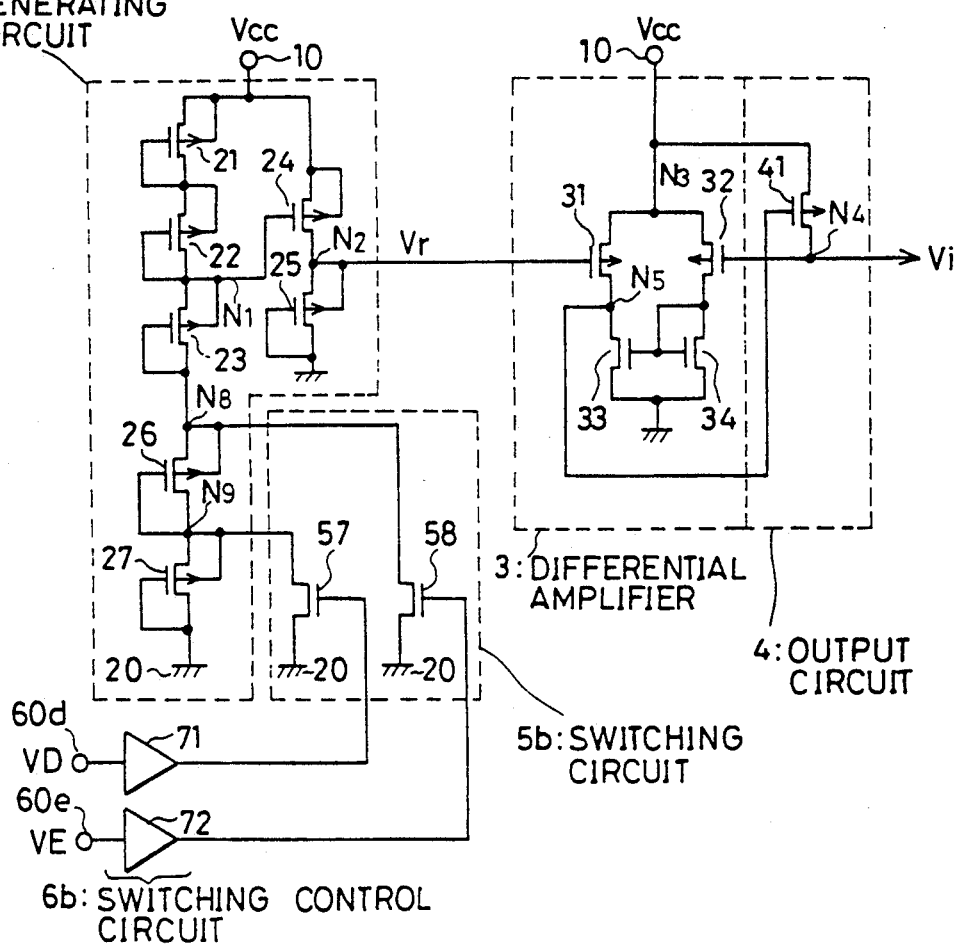
FIG. 6 is a circuit diagram showing the structure of a voltage converting circuit included in a semiconductor device in accordance with a third embodiment of the invention.

FIG. 6 is a circuit diagram showing the structure of a voltage converting circuit included in a semiconductor device in accordance with a third embodiment of the invention.

The voltage converting circuit of FIG. 6 is different from the voltage converting circuit of FIG. 1 in a way as follows. In the voltage converting circuit of FIG. 6, one reference voltage generating circuit 2e is provided in place of providing a plurality of reference voltage generating circuits. In the reference voltage generating circuit 2e, the drain of the transistor 23 is connected not to the ground terminal 20 but to the node N8. P channel MOS transistors 26, 27 are serially connected over the node N9 between the node N8 and the ground terminal 20.

The switching circuit 5b includes N channel MOS transistors 57, 58. The transistor 57 is connected between the node N9 of the reference voltage generating circuit 2e and the ground terminal 20, and the transistor 58 is connected between the node N8 in the reference voltage generating circuit 2e and the ground terminal 20.

The switching control circuit 6b includes buffers 71, 72. The control signal VD applied to the control terminal 60d is supplied to the gate of the transistor 57 in the switching circuit 5b over the buffer 71. The control signal VE applied to the control terminal 60e is supplied to the gate of the transistor 58 in the switching circuit 5b over the buffer 72.

When the control signal VE is set to "1", the transistor 58 turns on and the node N8 attains a ground potential. Thus, the reference voltage Vr supplied from the reference voltage generating circuit 2e becomes 3.3 V. When the control signal VD is set to "1" and the control signal VE is set to "0", then the transistor 57 turns on and the node N9 is set to a ground potential. Thus, the reference voltage Vr supplied from the reference voltage generating circuit 2e becomes 3.8 V. When both of the control signals VD, VE are set to "0", the transistors 57, 58 both turn off. The reference voltage Vr supplied from the reference voltage generating circuit 2e becomes 5.5 V.

In the embodiment of FIG. 6, the kind of the reference voltage may be arbitrarily set by changing the number of transistors connected between the node N8 in the reference voltage generating circuit 2e and the ground terminal 20.

As stated above, in the first, the second and the third embodiments, a plurality of reference voltages of different levels are supplied to the internal circuit 7 through the switching circuits 5, 5a, 5b, the differential amplifier 3 and the output circuit 4, so that it becomes possible to apply an internal voltage Vi to the internal circuit 7 on the same conditions both at the time of normal use and at the time of a test.

In the embodiment above, it is possible to arbitrarily generate a reference voltage at a higher level or a reference voltage at a lower level than the reference voltage at the time of normal operation.

In the embodiments of FIGS. 1 and 6, there is an advantage that internal voltages Vi at different levels may be internally generated even if power supply voltages Vcc at the same level are externally supplied.

Conversely, in the embodiment of FIG. 5, while it is necessary to externally supply reference voltages Vext at different levels, there is an advantage that the circuit configuration will be simplified.

In the embodiments above, while the case in which the internal circuit 7 is a DRAM is described, the internal circuit 7 is not limited to a DRAM, and may be other semiconductor memory device, still more other circuit.

Figure 7:
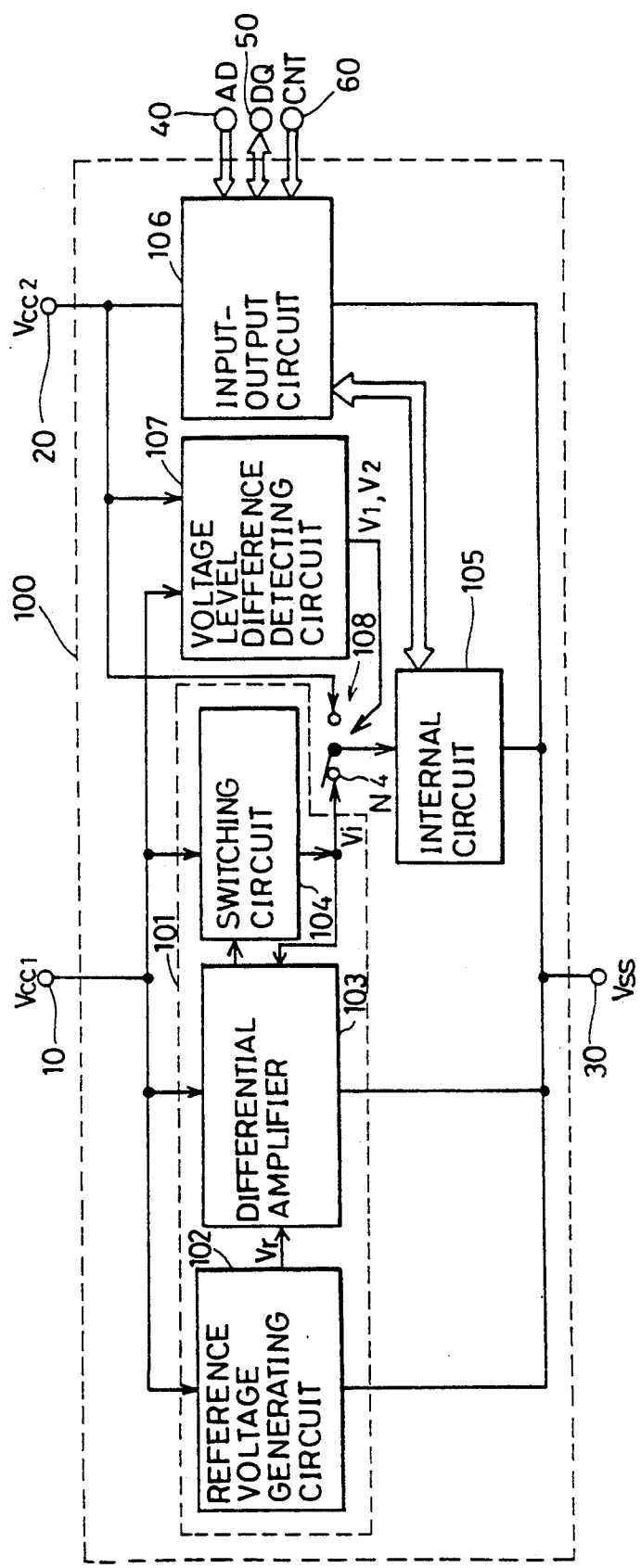
FIG. 7 is a block diagram showing the structure of a semiconductor device in accordance with a fourth embodiment of the invention.

FIG. 7 is a block diagram showing the structure of a semiconductor device in accordance with a fourth embodiment of the invention.

Figure 14:
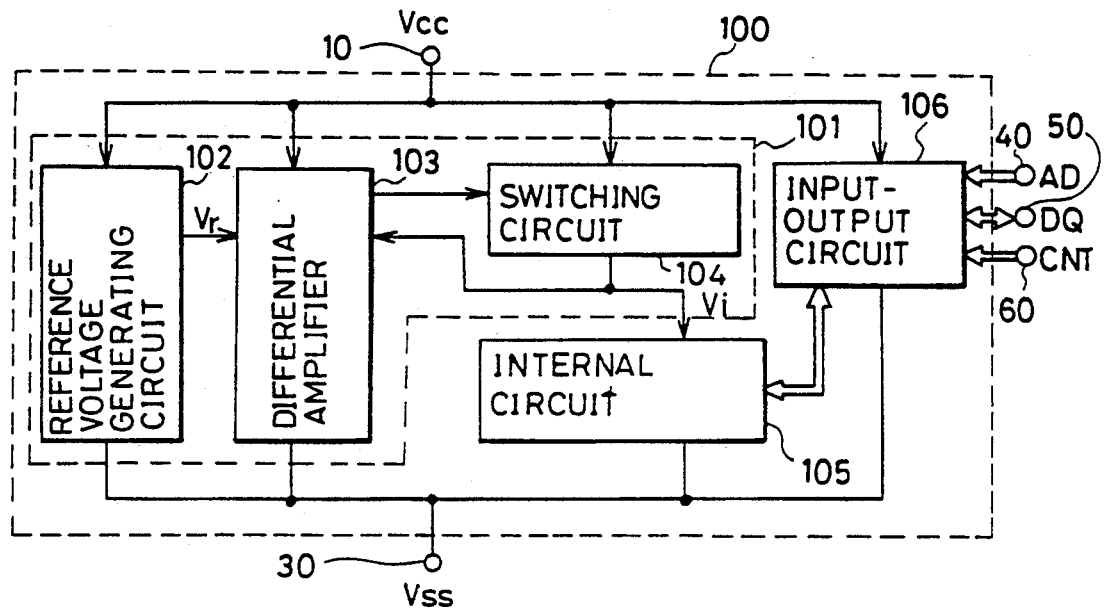
FIG. 14 is a block diagram showing the structure of a conventional semiconductor device containing a voltage converting circuit.

The semiconductor device 100 of FIG. 7 includes a first power supply terminal 10 for receiving a first power supply voltage Vcc 1, a second power supply terminal 20 for receiving a second power supply voltage Vcc 2 and a ground terminal 30 for receiving a ground potential Vss. The semiconductor device 100, as well as the conventional semiconductor device of FIG. 14, also includes an address terminal 40, a data terminal 50 and a control terminal 60.

The semiconductor device 100 includes a voltage converting circuit 101, an internal circuit 105 and an input-output circuit 106, and further includes a voltage level difference detecting circuit 107 and a switching circuit 108. The voltage converting circuit 101, the internal circuit and the input-output circuit 106 are respectively the same as the voltage converting circuit 101, the internal circuit 105 and the input-output circuit 106 shown in FIG. 14.

The first power supply voltage Vcc 1 from the first power supply terminal 10 is supplied to a reference voltage generating circuit 102, a differential amplifier 103 and a switching circuit 104 included in the voltage converting circuit 101, and also supplied to the voltage level difference detecting circuit 107. The second power supply voltage Vcc 2 from the second power supply terminal 20 is supplied to the input-output circuit 106 and the voltage level difference detecting circuit 107.

At the time of normal use, the second power supply voltage Vcc 2 is the same voltage as the first power supply voltage Vcc 1. At the time of normal use, the first power supply voltage Vcc 1 and the second power supply voltage Vcc 2 are set to, for example, 5 V. In this case, the switching circuit 108 is set on the side of the node N4. Accordingly, the internal circuit 105 is provided with the internal voltage Vi (for example 3.5 V) generated by the voltage converting circuit 101.

The voltage level difference detecting circuit 107 switches the switching circuit 108 to the side of the second power supply terminal 20 when the first and the second power supply voltages Vcc 1, Vcc 2 satisfy the following condition.

$$Vcc\,1 > Vcc\,2 + \alpha \qquad (1)$$

where $\alpha$ is a constant, for example, about 1V here, which can be set arbitrarily.

In an operation margin test, the second power supply voltage Vcc 2 is set to a test voltage of a low voltage or a high voltage, satisfying the condition of the equation (1). In an acceleration aging test, similarly, the second power supply voltage Vcc 2 is set to an acceleration voltage, satisfying the condition of the equation (1). In these cases, the internal circuit 105 is directly provided with the second power supply voltage Vcc 2 supplied over the second power supply terminal 20.

Figure 8:
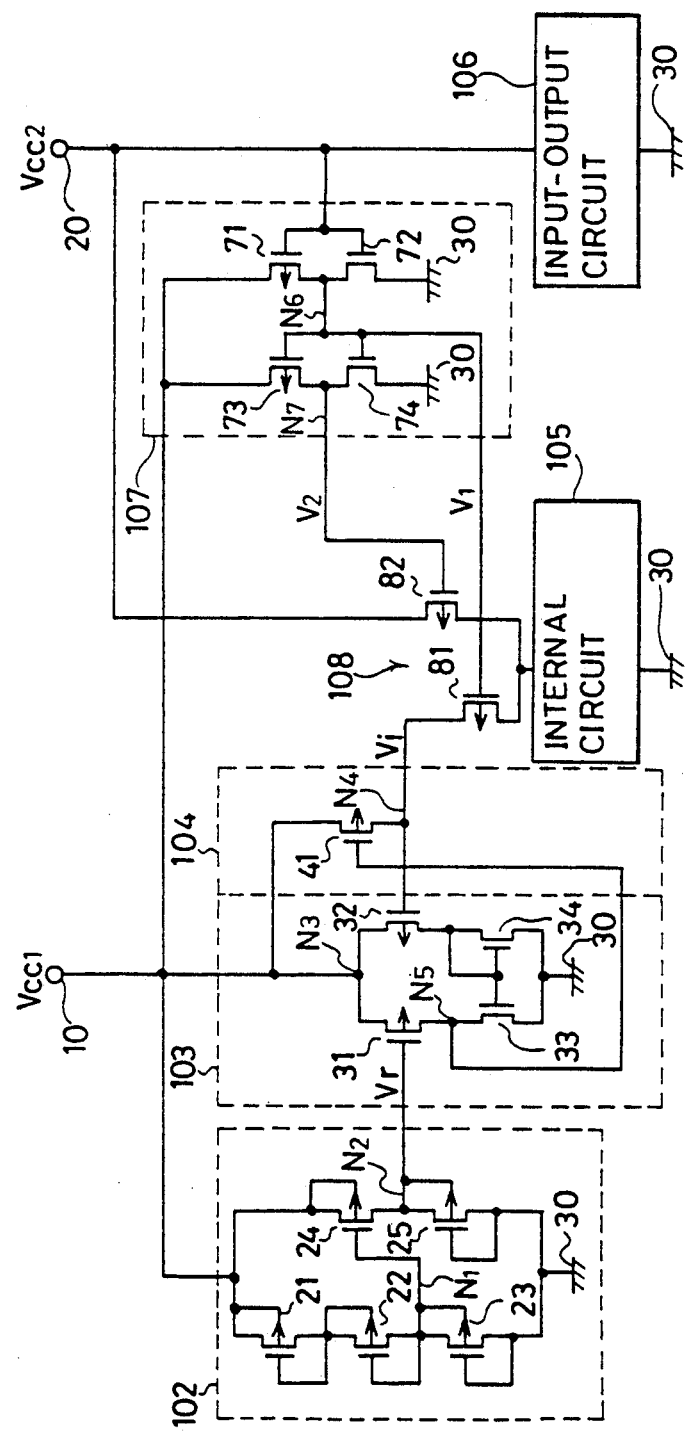
FIG. 8 is a diagram showing the circuit structure of the main portion of the semiconductor device in FIG. 7.

FIG. 8 is a diagram showing the circuit structure of the main portion of the semiconductor device 100 shown in FIG. 7.

The structures and the operations of the reference voltage generating circuit 102, the differential amplifier 103 and the switching circuit 104 are respectively the same as the structures and the operations of the reference voltage generating circuit 102, the differential amplifier 103 and the switching circuit 104 shown in FIG. 15. The node N3, however, is directly connected to the power supply terminal 10 without the transistors 35, 36 shown in FIG. 15 being connected between the node N3 of the differential amplifier 103 and the first power supply terminal 10. The transistors 35, 36 may be connected between the node 3 and the first power supply terminal 10 as in the differential amplifier 103 of FIG. 15.

The voltage level difference detecting circuit 107 includes a first inverter comprising a P channel MOS transistor 71 and an N channel MOS transistor 72, and a second inverter comprising a P channel MOS transistor 73 and an N channel MOS transistor 74. The transistor 71 is connected between the first power supply terminal 10 and the node N6, and the transistor 72 is connected between the node N6 and the ground terminal 30. The gates of the transistors 71, 72 are connected to the second power supply terminal 20. The transistor 73 is connected between the first power supply terminal 10 and the node N7, and the transistor 74 is connected between the node N7 and the ground terminal 30. The gates of the transistors 73, 74 are connected to the node N6.

The switching circuit 108 includes P channel MOS transistors 81, 82. The transistor 81 is connected between the node N4 of the switching circuit 104 and the internal circuit 105. The transistor 82 is connected between the second power supply terminal 20 and the internal terminal 105. The gate of the transistor 81 is connected to the node N6 of the voltage level difference detecting circuit 107, and the gate of the transistor 82 is connected to the node N7 of the voltage level difference detecting circuit 107. The node N6 is provided with a control voltage V1, and the node N7 is provided with a control voltage V2.

The operation of the circuit of FIG. 8 will be described referring to the voltage wave form diagram of FIG. 9.

Here, it is assumed that the first power supply voltage Vcc 1 is constant at 5 V. When the second power supply voltage Vcc 2 is higher than 5 V, the transistor 72 turns on and the transistor 71 turns off in the voltage level difference detecting circuit 107, so that the control voltage V1 of the node N6 attains an L level (about 0 V). As a result, the transistor 73 turns on, and the transistor 74 turns off, so that the control voltage V2 of the node N7 attains an H level (about 5 V). As a result, the transistor 81 turns on and the transistor 82 turns off in the switching circuit 108. Accordingly, the internal voltage Vi is supplied to the internal circuit 105.

When the second power supply voltage Vcc 2 is 4 V or below, the relationship of the equation (1) is satisfied. In this case, the transistor 71 turns on and the transistor 72 turns off in the voltage level difference detecting circuit 107, so that the control voltage V1 of the node N6 attains an H level (about 5 V). The transistor 74 turns on, and the transistor 73 turns off, so that the control voltage V2 of the node N7 attains an L level (about 0 V) As a result, the transistor 81 turns off, and the transistor 82 turns on in the switching circuit 108. Accordingly, the second power supply voltage Vcc 2 from the second power supply terminal 20 is supplied to the internal circuit 105.

Figure 9:
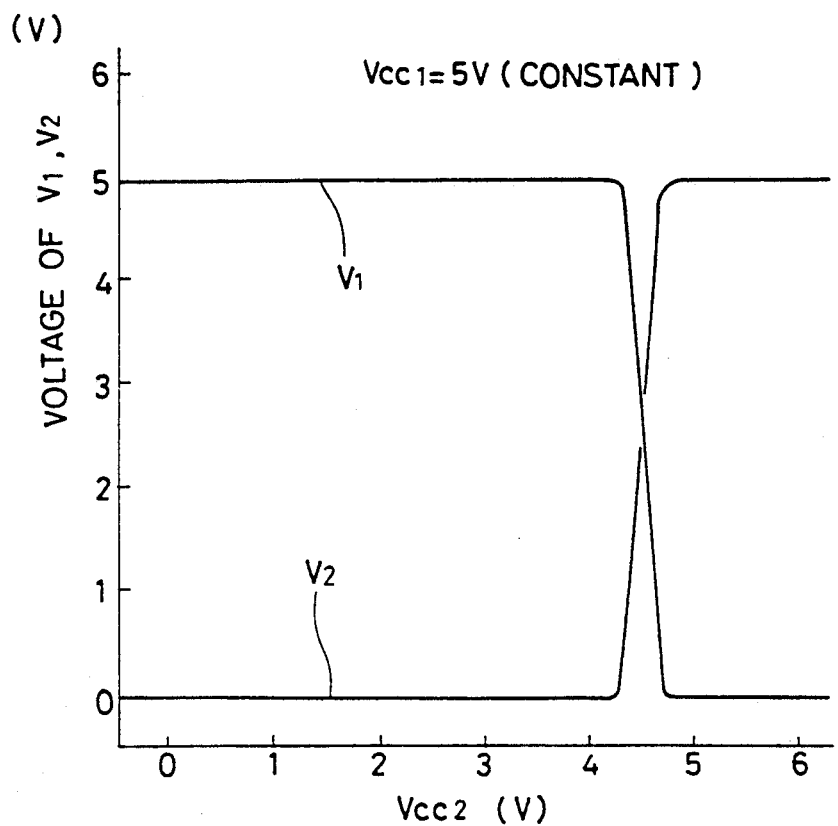
FIG. 9 is a diagram showing an input/output characteristic of a voltage level difference detecting circuit shown in FIG. 8.

The characteristic shown in FIG. 9 may be obtained by appropriately selecting the gate lengths and the gate widths of the transistors 71 to 74 constituting the first and the second inverters of the voltage level difference detecting circuit 107 to optimize the threshold value of the inverter characteristic.

When it is intended to supply to the internal circuit 105 a higher voltage (for example 7 V) than the voltage (5 V) at the time of normal use, the first power supply voltage Vcc 1 is set to a still higher voltage (for example 9 V), and the second power supply voltage Vcc 2 is set to a predetermined voltage (7 V). In this case, the condition of the equation (1) is satisfied, so that the internal circuit 105 is provided with the second power supply voltage Vcc 2.

The value of $\alpha$ of the equation (1) is determined by the ratio of the sizes between the N channel MOS transistor and the P channel MOS transistor in the voltage level difference detecting circuit 107. As the size of the N channel MOS transistor is increased, the value of $\alpha$ becomes larger.

Figure 10:
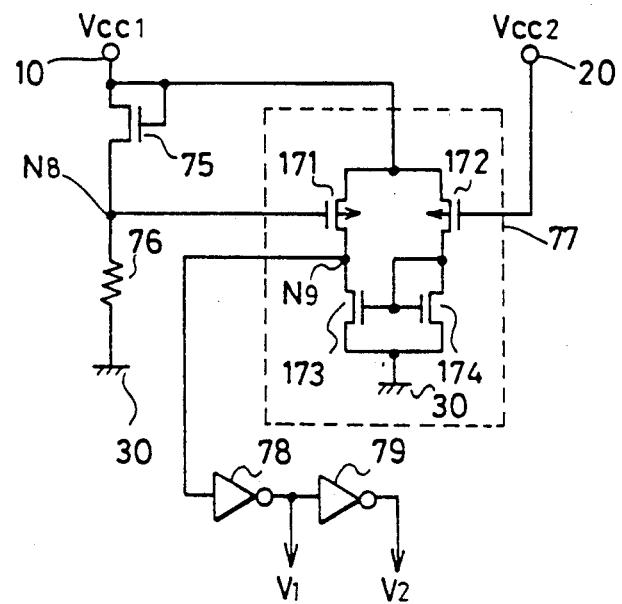
FIG. 10 is a diagram showing another example of the structure of the voltage level difference detecting circuit.

FIG. 10 is a circuit diagram showing another example of the structure of the voltage level difference detecting circuit 107.

The voltage level difference detecting circuit of FIG. 10 includes an N channel MOS transistor 75, a resistor 76, a differential amplifier 77 and inverters 78, 79. The transistor 75 has a diode connection between the first power supply terminal 10 and the node N8. The resistor 76 is connected between the node N8 and the ground terminal 30. The differential amplifier 77 includes P channel MOS transistors 171, 172 and N channel MOS transistors 173, 174. The connecting point of the transistor 171 and the transistor 172 is connected to the first power supply terminal 10. The connecting point of the transistor 173 and the transistor 174 is connected to the ground terminal 30. The gate of the transistor 171 is connected to the node N8, and the gate of the transistor 172 is connected to the second power supply terminal 20. The node N9 which is a connecting point of the transistor 171 and the transistor 173 is connected to the input terminal of the inverter 78. The output terminal of the inverter 78 is connected to the input terminal of the inverter 79. A control voltage V1 is supplied from the output terminal of the inverter 78, and a control voltage V2 is supplied from the output terminal of the inverter 79.

The potential of the node N8 becomes the first power supply voltage Vcc $1-\alpha$, where when the threshold voltage of the N channel MOS transistor 75 having a diode connection is set to 1 V, $\alpha$ becomes 1 V. If the first and the second power supply voltages Vcc 1, Vcc 2 satisfy the condition of the equation (1), the value of the current flowing through the transistor 171 becomes smaller than the value of the current flowing through the transistor 172. Accordingly, the potential of the node N9 is decreased, so that the control voltage V1 supplied from the inverter 78 attains an H level, and the control voltage V2 supplied from the inverter 79 attains an L level.

If the first and the second power supply voltages Vcc 1, Vcc 2 do not satisfy the condition of the equation (1), conversely, the control voltage V1 attains an L level, and the control voltage V2 attains an H level.

The input-output characteristic of the voltage level difference detecting circuit of FIG. 10 thus becomes similar to the input-output characteristic of FIG. 9.

Figure 11:
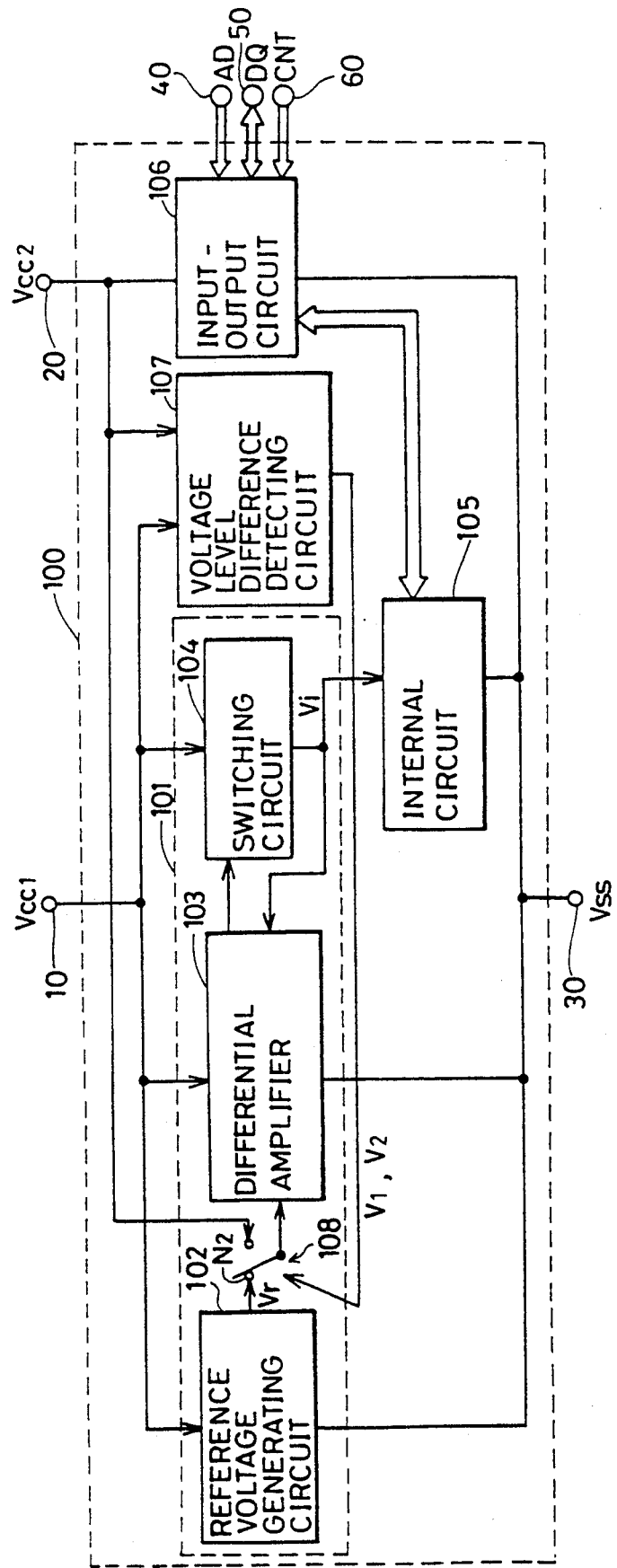
FIG. 11 is a block diagram showing the structure of a semiconductor device in accordance with a fifth embodiment of the invention.

FIG. 11 is a block diagram showing the structure of a semiconductor device in accordance with a fifth embodiment of the invention.

The semiconductor device 100 of FIG. 11 is different from the semiconductor device 100 of FIG. 7 in that the switching circuit 108 is provided between the reference voltage generating circuit 102 and the differential amplifier 103. In the semiconductor device 100 of FIG. 11, the switching circuit 108 is set to the side of the node N2 of the reference voltage generating circuit 102 at the time of normal use. When the condition of the equation (1) is satisfied, the switching circuit 108 is switched to the side of the second power supply terminal 20. In this case, the internal circuit 105 is operated by the second power supply voltage Vcc 2 externally applied over the differential amplifier 103 and the switching circuit 104.

Accordingly, if the second power supply voltage Vcc 2 is changed, satisfying the condition of the equation (1), an operation margin test and an acceleration aging test can be conducted in the same manner as the semiconductor device 100 shown in FIG. 7.

Figure 12:
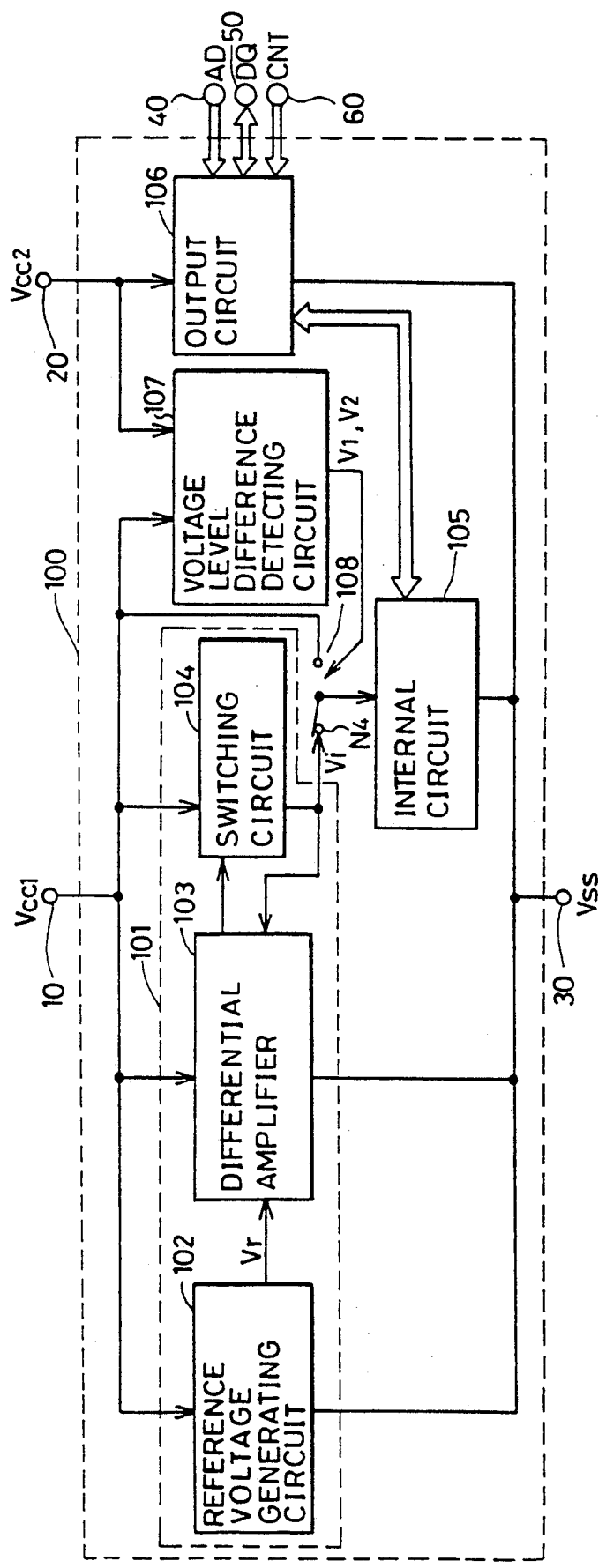
FIG. 12 is a block diagram showing the structure of a semiconductor device in accordance with a sixth embodiment of the invention.
Figure 13:
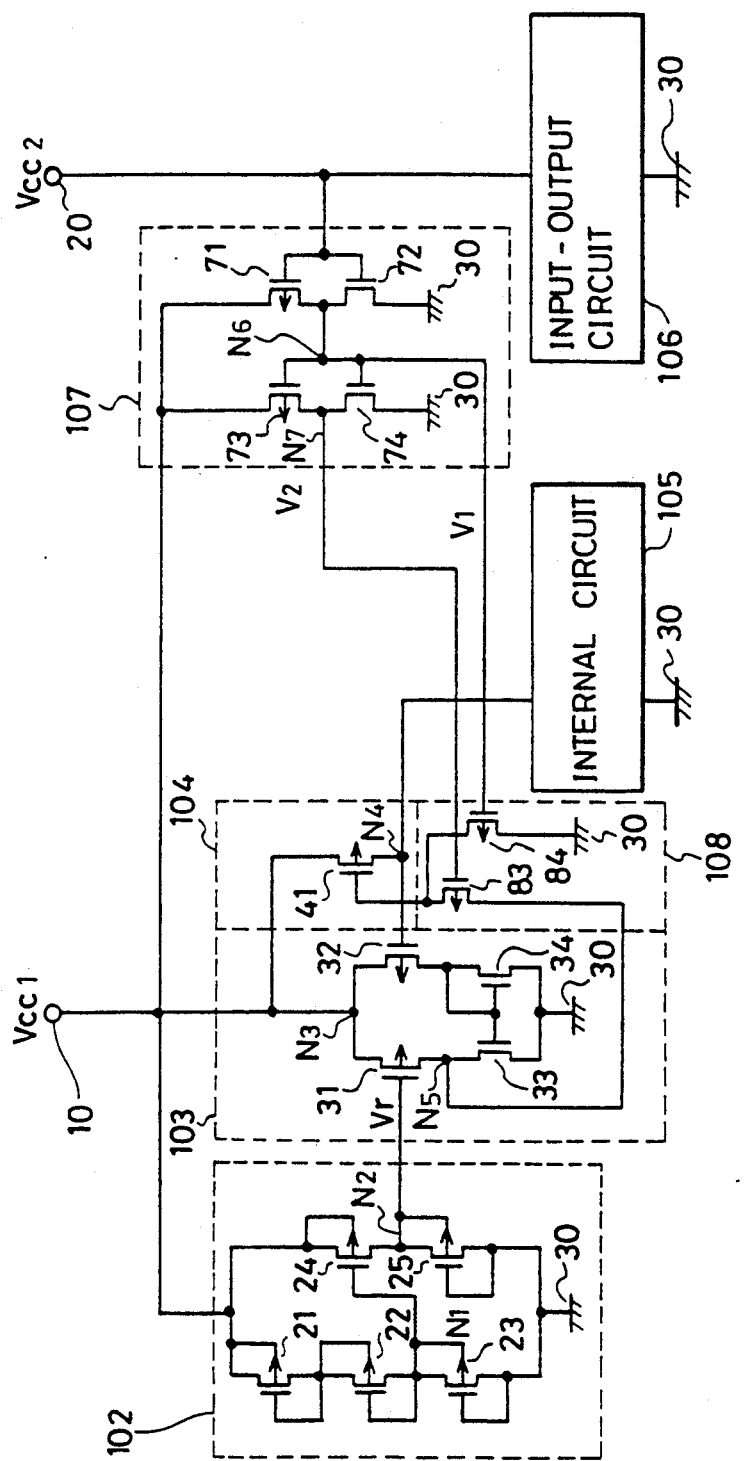
FIG. 13 is a diagram showing a circuit structure of the main portion of the semiconductor device of FIG. 12.

FIG. 12 is a block diagram showing the structure of a semiconductor device in accordance with a sixth embodiment of the invention. FIG. 13 is a diagram showing the circuit structure of the main portion of the semiconductor device 100 of FIG. 12.

The semiconductor device 100 of FIG. 12 is different from the semiconductor device 100 of FIG. 7 in that the switching circuit 108 is connected to the first power supply terminal 10. In the semiconductor device 100 of FIG. 12, when the first and the second power supply voltages Vcc 1, Vcc 2 satisfy the condition of the equation (1), the first power supply voltage Vcc 1 is supplied to the internal circuit 105.

For example, when it is intended to supply a high voltage of 7 V to the internal circuit 105, the first power supply voltage Vcc 1 is set to 7 V, and the second power supply voltage Vcc 2 is set to 5 V. When it is intended to supply a low voltage of 3.5 V to the internal circuit 105, the first power supply voltage Vcc 1 is set to 3.5 V, and the second power supply voltage Vcc 2 is set to, for example, 0 V.

In this way, in the semiconductor device 100 of FIG. 12, it is possible to directly operate the internal circuit 105 with the externally applied first power supply voltage Vcc 1 only when the condition of the equation (1) is satisfied.

In FIG. 13, the structures and the operations of the reference voltage generating circuit 102, the differential amplifier 103, the switching circuit 104 and the voltage level difference detecting circuit 107 are respectively the same as the structures and the operations of the reference voltage generating circuit 102, the differential amplifier 103, the switching circuit 104 and the voltage level difference detecting circuit 107 shown in FIG. 1. The switching circuit 108 includes P channel MOS transistors 83, 84. The transistor 83 is connected between the node N5 of the differential amplifier 103 and the gate of the transistor 41 of the switching circuit 104. The transistor 84 is connected between the gate of the transistor 41 and the ground terminal 30 of the switching circuit 104. The gate of the transistor 83 is connected to the node N7 of the voltage level difference detecting circuit 107, and the gate of the transistor 84 is connected to the node N6.

When the first and the second power supply voltages Vcc 1, Vcc 2 satisfy the condition of the equation (1), the control voltage V1 attains an L level, and the control voltage V2 attains an H level. The transistor 84 turns on, and the transistor 83 turns off, so that the voltage of the gate of the transistor 41 is set to the ground potential Vss, and the transistor 41 turns on. The internal circuit 105 is therefore provided with the first power supply voltage Vcc 1.

When the first and the second power supply voltages Vcc 1, Vcc 2 do not satisfy the condition of the equation (1), the control voltage V1 attains an H level, and the control voltage V2 attains an L level. The transistor 83 turns on, and the transistor 84 turns off, so that the internal circuit 105 is provided with the internal voltage Vi.

In the embodiment of FIG. 13, an advantage can be obtained that generally a large-sized transistor 41 can be used both at the time of normal operation and at the time of a test.

The above-mentioned fourth, fifth and sixth embodiments, any voltage can be supplied to the internal circuit 105 by changing the first power supply voltage Vcc 1 or the second power supply voltage Vcc 2, satisfying the condition of the equation (1).

Similarly, the internal circuit 105 may be operated with the first power supply voltage Vcc 1 or the second power supply voltage Vcc 2 by changing the first power supply voltage Vcc 1 or the second power supply voltage Vcc 2, satisfying the condition of Vcc $2 >$ Vcc $1 + \alpha$.

In the embodiment above, while an address signal AD, data DQ and a control signal CNT are driven by an externally applied power supply voltage, a structure in which an address signal AD and a control signal CNT are driven by an internal voltage Vi is also possible.

Furthermore, in the above-mentioned embodiment, while the case in which the internal circuit 105 is a memory is described, the internal circuit 105 is not limited to a memory and may be other circuit.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device containing a voltage converting circuit for converting an externally applied power supply voltage to a predetermined voltage and providing the same to an internal circuit, said voltage converting circuit comprising:

reference voltage generating means for receiving the externally applied power supply and generating a plurality of reference voltages at different levels;

selecting means for selecting one of said plurality of reference voltages; and output means for supplying the reference voltage selected by said selecting means to said internal circuit, wherein said output means comprises control means for effecting voltage control in a negative feedback manner so that the voltage to be supplied to said internal circuit may be constant.

2. The semiconductor device according to claim 1, wherein said reference voltage generating means comprises a plurality of circuit means for receiving said power supply voltage and respectively generating a plurality of different reference voltages.

3. The semiconductor device according to claim 2, wherein said selecting means comprises a plurality of switch means connected between each of said plurality of circuit means and said output means, any one of said plurality of switch means being turned on in response to control signals.

4. The semiconductor device according to claim 3, further comprising decode means for decoding said control signals and supplying the decoded signals to said plurality of switch means.

5. The semiconductor device according to claim 1, further comprising:

an external terminal for receiving an external voltage and supplying the external voltage as an external reference voltage, wherein said reference voltage generating means includes circuit means for receiving said power supply voltage and generating a first reference voltage.

6. The semiconductor device according to claim 5, wherein said selecting means comprises switch means responsive to a control signal for selectively supplying either one of the output signals of said circuit means and said external terminal to said output means.

7. The semiconductor device according to claim 1, wherein
   said reference voltage generating means comprises:
   circuit means for receiving a power supply voltage and generating a reference voltage;
   said circuit means comprises:
   voltage shifting means for shifting a power supply voltage applied to said circuit means and
   control means for controlling the value of voltage to be shifted by said voltage shifting means.

8. The semiconductor device according to claim 7, wherein
   said voltage shifting means comprises a plurality of voltage drop means serially connected between said power supply voltage and ground over a plurality of nodes, and
   said control means comprises a plurality of switch means respectively coupled between said plurality of nodes and said power supply.

9. The semiconductor device according to claim 1, wherein said control means comprises;
   differential amplification means receiving said power supply voltage and having a first terminal connected to the output of said reference voltage generating means and a second terminal connected to said internal circuit, for differentially amplifying the voltage between said first and second terminals; and
   transistor means coupled between said power supply voltage and said second terminal and responsive to the output voltage of said reference voltage generating means for being rendered conductive or nonconductive.

10. A semiconductor device comprising:
    first and second power supply terminals for respectively receiving externally applied first and second power supply voltages;
    voltage converting means for receiving the first power supply voltage from said first power supply terminal and converting the first power supply voltage to a predetermined voltage;
    internal circuit means operating by said predetermined voltage converted by said voltage converting means;
    detecting means for receiving said first and second power supply voltages and detecting that the voltage difference between the first and the second power supply voltages has attained a predetermined voltage difference; and
    switching means for supplying said second power supply voltage, in place of said predetermined voltage converted by said voltage converting means, to said internal circuit means when said detecting means detects said predetermined voltage difference.

11. The semiconductor device according to claim 10, wherein said voltage converting means comprises:
    reference voltage generating means receiving the first power supply voltage from said first power supply terminal for generating a reference voltage based on the first power supply voltage; and
    control means for effecting voltage control in a negative feedback manner so that the voltage to be supplied to said internal circuit means may be constant,
    said switching means being responsive to the output signal of said detecting means for selectively supplying either one of the output voltage from said control means and the second power supply voltage from said second power supply terminal to said internal circuit means.

12. The semiconductor device according to claim 10, wherein said voltage converting means comprises
    reference voltage generating means for receiving the first power supply voltage from said first power supply terminal for generating a reference voltage based on the first power supply voltage; and
    control means for effecting voltage control in a negative feedback manner so that the voltage to be supplied to said internal circuit means may be constant, and
    said switching means selectively supplies either one of the reference voltage from said reference voltage generating means and the second power supply voltage from said second power supply terminal to said control means in response to the output signal of said detecting means.

13. The semiconductor device according to claim 10, wherein said detecting means comprises
    an output node for supplying a signal representing the result of detection;
    field-effect transistor means of a first conductivity channel type connected between said first power supply terminal and said output node, having a control terminal connected to said second power supply terminal; and
    field-effect transistor means of a second conductivity channel type connected between said output node and a predetermined potential, having a control terminal connected to said second power supply terminal.

14. The semiconductor device according to claim 10, wherein said detecting means comprises
    voltage shifting means for shifting one of said first and second power supply voltages by said predetermined voltage difference; and
    comparison means for comparing the voltage shifted by said voltage shifting means with the other of said first and second power supply voltages.

15. An operating method of a semiconductor device having an internal circuit driven by a predetermined voltage, comprising the steps of:
    generating a plurality of reference voltages at different levels based on an externally applied power supply voltage;
    selecting one of said plurality of references voltages in response to an externally applied control signal; and
    supplying said selected reference voltage to said internal circuit, wherein
    said step of supplying includes effecting voltage control in a negative feedback manner so that the voltage to be supplied to said internal circuit may be constant.

16. An operating method of a semiconductor device containing an internal circuit driving by a predetermined voltage, comprising the steps of:
    respectively receiving externally applied first and second power supply voltages;
    converting said first power supply voltage to a predetermined voltage;
    supplying said converted predetermined voltage to said internal circuit;

detecting that the difference between said first and the second voltages has attained a predetermined voltage difference; and supplying said first voltage, in place of said converted predetermined voltage, to said internal circuit means on detecting said predetermined voltage difference.

17. A semiconductor device comprising:

first and second power supply terminals for respectively receiving externally applied first and second power supply voltages;

voltage converting means for receiving the first power supply voltage from said first power supply terminal and converting the first power supply voltage to a predetermined voltage;

internal circuit means operating by said predetermined voltage converted by said voltage converting means;

detecting means for receiving said first and second power supply voltages and detecting that the voltage difference between the first and the second power supply voltages has attained a predetermined voltage difference; and switching means for supplying said first power supply voltage, in place of said predetermined voltage converted by said voltage converting means, to said internal circuit means when said detecting means detects said predetermined voltage difference.

18. The semiconductor device according to claim 17, wherein said voltage converting means comprises:

reference voltage generating means for receiving the first power supply voltage from said first power supply terminal for generating a reference voltage based on the first power supply voltage; and control means for effecting voltage control in a negative feedback manner so that the voltage to be supplied to said internal circuit means may be constant, and said switching means selectively supplies either one of the output voltage from said control means and the first power supply voltage from said first power supply terminal to said internal circuit means in response to the output signal of said detecting means.

19. The semiconductor device according to claim 17, wherein said detecting means comprises an output node for supplying a signal representing the result of detection;

field-effect transistor means of a first conductivity channel type connected between said first power supply terminal and said output node, having a control terminal connected to said second power supply terminal; and field-effect transistor means of a second conductivity channel type connected between said output node and a predetermined potential, having a control terminal connected to said second power supply terminal.

20. The semiconductor device according to claim 17, wherein said detecting means comprises voltage shifting means for shifting one of said first and second power supply voltages by said predetermined voltage difference; and comparison means for comparing the voltage shifted by said voltage shifting means with the othr of said first and second power supply voltages.

21. An operating method of a semiconductor device containing an internal circuit driving by a predetermined voltage, comprising the steps of:

respectively receiving externally applied first and second power supply voltages;

converting said first power supply voltage to a predetermined voltage;

supplying said converted predetermined voltage to said internal circuit;

detecting that the difference between said first and the second voltages has attained a predetermined voltage difference; and supplying said second voltage, in place of said converted predetermined voltage, to said internal circuit means on detecting said predetermined voltage difference.

22. A semiconductor device containing a voltage converting circuit for converting an externally applied power supply voltage to a predetermined voltage and providing the same to an internal circuit, said voltage converting circuit comprising:

reference voltage generating means for receiving the externally applied power supply and generating a plurality of reference voltages at different levels;

selecting means for selecting one of said plurality of reference voltages; and output means for supplying the reference voltage selected by said selecting means to said internal circuit, wherein said reference voltage generating means comprises circuit means for receiving a power supply voltage and generating a reference voltage;

said circuit means comprises voltage shifting means for shifting a power supply voltage applied to said circuit means and control means for controlling the value of voltage to be shifted by said voltage shifting means;

said voltage shifting means comprises a plurality of voltage drop means serially connected between said power supply voltage and ground over a plurality of nodes; and said control means comprises a plurality of switch means respectively coupled between said plurality of nodes and said power supply voltage.

23. A semiconductor device containing a voltage converting circuit for converting an externally applied power supply voltage to a predetermined voltage and providing the same to an internal circuit, said voltage converting circuit comprising:

reference voltage generating means for receiving the externally applied power supply and generating a plurality of reference voltages at different levels;

selecting means for selecting one of said plurality of reference voltages; and output means for supplying the reference voltage selected by said selecting means to said internal circuit; wherein said output means comprises control means for effecting voltage control in a negative feedback manner so that the voltage to be supplied to said internal circuit may be constant, and said selecting means is responsive to at least one control signal.

24. A semiconductor device comprising:

first and second power supply terminals for respectively receiving externally applied first and second power supply voltages;

voltage converting means for receiving the first power supply voltage from said first power supply terminal and converting the first power supply voltage to a predetermined voltage;

an internal circuit operating in response to a supplied voltage;

detecting means for receiving said first and second power supply voltages and detecting that the voltage difference between the first and the second power supply voltages has attained a predetermined voltage difference; and switching means for supplying the voltage to said internal circuit, wherein said voltage converting means comprises reference voltage generating means for receiving the first power supply voltage from said first power supply terminal for generating a reference voltage based on the first power supply voltage, and control means for effecting voltage control in a negative feedback manner so that the voltage to be supplied to said internal circuit may be constant, and said switching means selectively supplies either one of the output voltage from said control means and the first power supply voltage from said first power supply terminal to said internal circuit in response to the output signal of said detecting means.

25. A semiconductor device comprising:

first and second power supply terminals for respectively receiving externally applied first and second power supply voltages;

voltage converting means for receiving the first power supply voltage from said first power supply terminal and converting the first power supply voltage to a predetermined voltage;

an internal circuit operating in response to a supplied voltage;

detecting means for receiving said first and second power supply voltages and detecting that the voltage difference between the first and the second power supply voltages has attained a predetermined voltage difference; and switching means for supplying a voltage to said internal circuit, wherein said voltage converting means comprises reference voltage generating means receiving the first power supply voltage from said first power supply terminal for generating a reference voltage based on the first power supply voltage, and control means for effecting voltage control in a negative feedback manner so that the voltage to be supplied to said internal circuit may be constant, and said switching means is responsive to the output signal of said detecting means for selectively supplying either one of the output voltage from said control means and the second power supply voltage from said second power supply terminal to said internal circuit.

26. A semiconductor device comprising:

first and second power supply terminals for respectively receiving externally applied first and second power supply voltages;

voltage converting means for receiving the first power supply voltage from said first power supply terminal and converting the first power supply voltage to a predetermined voltage;

an internal circuit operating in response to a supplied voltage;

detecting means for receiving said first and second power supply voltages and detecting that the voltage difference between the first and the second power supply voltages has attained a predetermined voltage difference; and switching means for supplying a voltage to said internal circuit, wherein said voltage converting means comprises reference voltage generating means for receiving the first power supply voltage from said first power supply terminal for generating a reference voltage based on the first power supply voltage, and control means for effecting voltage control in a negative feedback manner so that the voltage supplied to said internal circuit may be constant, and said switching means selectively supplies either one of the reference voltage from said reference voltage generating means and the second power supply voltage from said second power supply terminal to said control means in response to the output signal of said detecting means.

* * * * *